(12) United States Patent
Kundu et al.

(10) Patent No.: US 10,090,221 B2
(45) Date of Patent: Oct. 2, 2018

(54) SEMICONDUCTOR DEVICE WITH SELF-HEAT REDUCING LAYERS

(71) Applicant: TAIWAN SEMICONDUCTOR MANUFACTURING COMPANY, LTD., Hsinchu (TW)

(72) Inventors: Amit Kundu, Hsinchu (TW); Jaw-Juinn Horng, Hsinchu (TW); Chung-Hui Chen, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 31 days.

(21) Appl. No.: 15/370,291

(22) Filed: Dec. 6, 2016

(65) Prior Publication Data

US 2017/0084512 A1 Mar. 23, 2017

Related U.S. Application Data

(62) Division of application No. 14/154,618, filed on Jan. 14, 2014, now Pat. No. 9,536,790.

(51) Int. Cl.
| | |
|---|---|
| H01L 29/76 | (2006.01) |
| H01L 23/367 | (2006.01) |
| H01L 27/02 | (2006.01) |
| H01L 21/8234 | (2006.01) |
| H01L 29/78 | (2006.01) |
| H01L 27/12 | (2006.01) |
| H01L 21/761 | (2006.01) |
| H01L 29/06 | (2006.01) |

(Continued)

(52) U.S. Cl.
CPC .......... *H01L 23/367* (2013.01); *H01L 21/761* (2013.01); *H01L 21/823431* (2013.01); *H01L 27/0248* (2013.01); *H01L 27/0292* (2013.01); *H01L 27/1211* (2013.01); *H01L 29/0623* (2013.01); *H01L 29/0847* (2013.01); *H01L 29/6681* (2013.01); *H01L 29/785* (2013.01); *H01L 29/7851* (2013.01); *H01L 23/3677* (2013.01); *H01L 2924/0002* (2013.01)

(58) Field of Classification Search
CPC ............. H01L 27/0248; H01L 27/0292; H01L 21/761; H01L 21/82343
USPC ........................................ 257/409, 495, 620
See application file for complete search history.

(56) References Cited

U.S. PATENT DOCUMENTS

| | | |
|---|---|---|
| 7,772,682 B1 | 8/2010 | Zhang |
| 7,906,836 B2 | 3/2011 | Chen |

(Continued)

OTHER PUBLICATIONS

Office Action dated Oct. 26, 2015 from corresponding No. TW 103144816.

*Primary Examiner* — Matthew E Warren
(74) *Attorney, Agent, or Firm* — Hauptman Ham, LLP

(57) ABSTRACT

A method of forming a semiconductor device includes implanting dopants in a first region of the semiconductor device to form a source region. The method further includes forming a guard ring in a second region of the semiconductor device, the guard ring being separated from the source region by a first spacing. The method further includes depositing a first heat conductive layer over the source region, wherein the first heat conductive layer is directly coupled to the source region and directly coupled to the guard ring. The first heat conductive layer is configured to dissipate heat generated by the semiconductor device from the source region to the guard ring.

20 Claims, 9 Drawing Sheets

(51) Int. Cl.
*H01L 29/08* (2006.01)
*H01L 29/66* (2006.01)

(56) References Cited

U.S. PATENT DOCUMENTS

2010/0123219 A1 5/2010 Chen et al.
2013/0299890 A1* 11/2013 Oh ..................... H01L 27/108
                                                                          257/306

* cited by examiner

SEMICONDUCTOR DEVICE WITH SELF-HEAT REDUCING LAYERS

PRIORITY CLAIM

The present application is a divisional of U.S. application Ser. No. 14/154,618, filed Jan. 14, 2014, which is incorporated by reference herein in its entirety.

BACKGROUND

Device manufacturers are continually challenged to deliver value and convenience to consumers by, for example, providing integrated circuits that provide quality performance. Integrated circuits often increase in temperature during use, which often limits the performance capability of the integrated circuit.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

Figure 1:
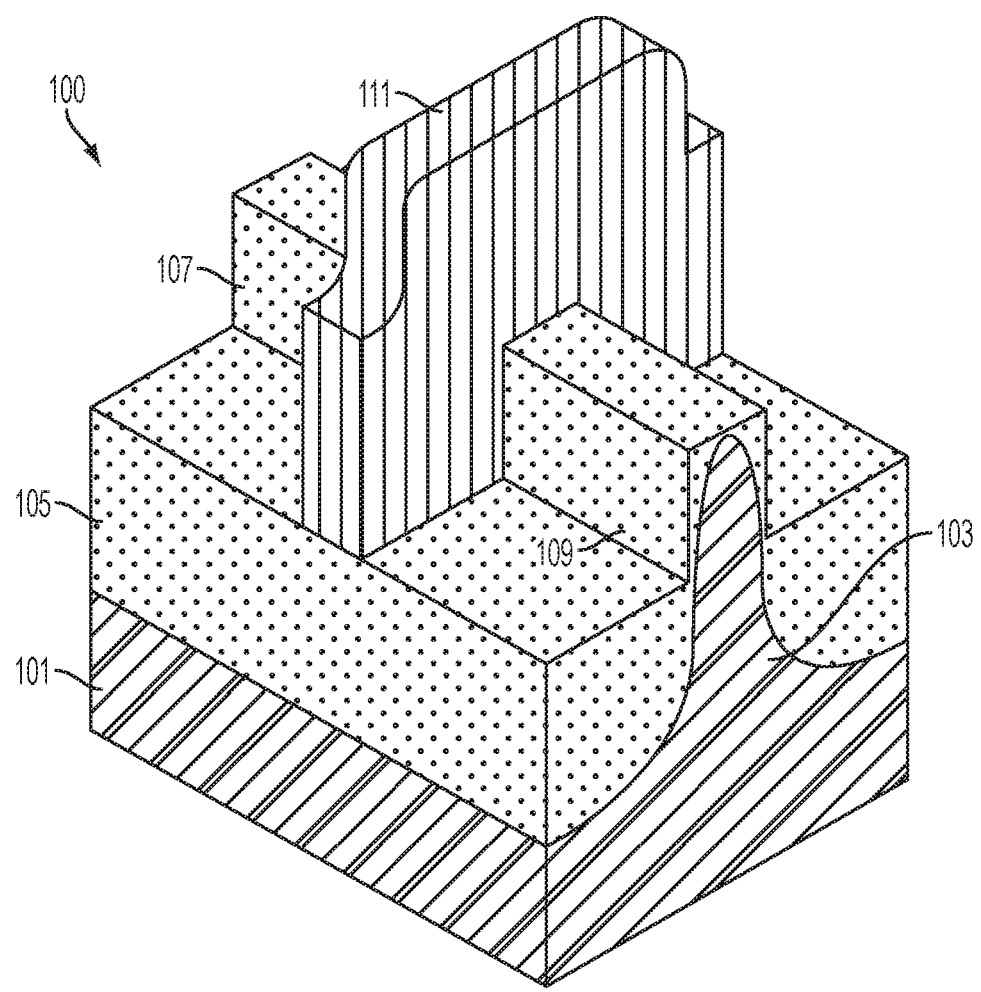
FIG. 1 is a high-level diagram of an exemplary semiconductor device configured to dissipate heat through a plurality of heat reduction layers, in accordance with one or more embodiments.

The following disclosure provides many different embodiments, or examples, for implementing different features of the invention. Specific examples of components and arrangements are described below to simplify the present disclosure. These are examples and are not intended to be limiting.

Integrated circuits often increase in temperature during use, which limits the performance capability of the integrated circuit. For example, self-heating in semiconductor devices such as fin field effect transistors (FINFETs) has the capability of impacting device reliability, both in bulk and silicon-on-oxide (SOI). Typical FINFETs are arranged to dissipate most heat into metal interconnects that are actively used in the function of the integrated circuit. Electromigration degradation caused by temperature increase in metal interconnects, for example, is an issue for device designers. But, conventional design practices do not focus on specific layout styles to mitigate temperature build-up in metal interconnects caused by device self-heating during use.

For example, many semiconductor devices comprise a substrate, a source, a drain, a guard ring, an oxide defined region over the source, an oxide defined region, or epitaxial layer, over the guard ring, a metal interconnect coupled by at least two vias to the oxide defined region over the source and the oxide defined region over the guard ring, and a gate. Such semiconductor devices have a spacing between the oxide defined region over the source and the oxide defined region over the guard ring. In use, these semiconductor devices generate heat. A majority of the generated heat dissipates from the source or drain to the metal interconnect by way of at least one of the at least two vias to the epitaxial layer. Some of the heat eventually passes to the guard ring by way of another one of the at least two vias. Because there are a limited number of heat dissipation paths, and because most of the heat passes to the interconnect, performance of the semiconductor device is greatly affected. For example, even a temperature rise of as little as 10 degrees Celsius can impact the performance of the device such as by causing electromigration degradation. Additionally, self-heating has the capability of impacting other devices of an integrated circuit within a few micrometers of the generated heat.

FINFETs, for example, have small lengths of approximately 16 nm to 20 nm and heat generated in the FINFET during use almost identically heats both the source and the drain. Many FINFET layout designs, however, do not sufficiently dissipate heat because conventional FINFET layout designs lack dissipation paths that divert heat to the substrate or to dummy metals. Contrarily, self-heat generated in a device impacts the actual interconnect metal layers that are electrically connected in the device, or in close proximity to one another, which is detrimental for metal interconnect performance. The generated heat also often propagates to the gate, which further hinders device performance.

FIG. 1 is a high-level diagram of an exemplary semiconductor device 100 configured to dissipate heat through a plurality of heat reduction layers, in accordance with one or more embodiments.

The semiconductor device 100 in this example is a FINFET. The semiconductor device comprises a substrate 101 having a fin 103, a first layer 105 over the substrate 101, a source region 107, a drain region 109, and a gate structure 111 over the first layer 105 and the fin 103. The semiconductor device 100 is configurable based on one or more design rules to have a variety layouts of source interconnects, metal interconnects, and gate interconnects configured to dissipate heat generated by the semiconductor device 100 from at least the source region 107 to the substrate 101, other device features and/or the ambient. In some embodiments, the substrate 101 is a silicon substrate, and the gate structure 111 comprises a poly-silicon material, a material having a high dielectric constant (e.g. a high-K material), or other suitable material. Dissipating the generated heat from the source region 107 mitigates electromigration degradation in back-end interconnects, for example.

Figure 2A:
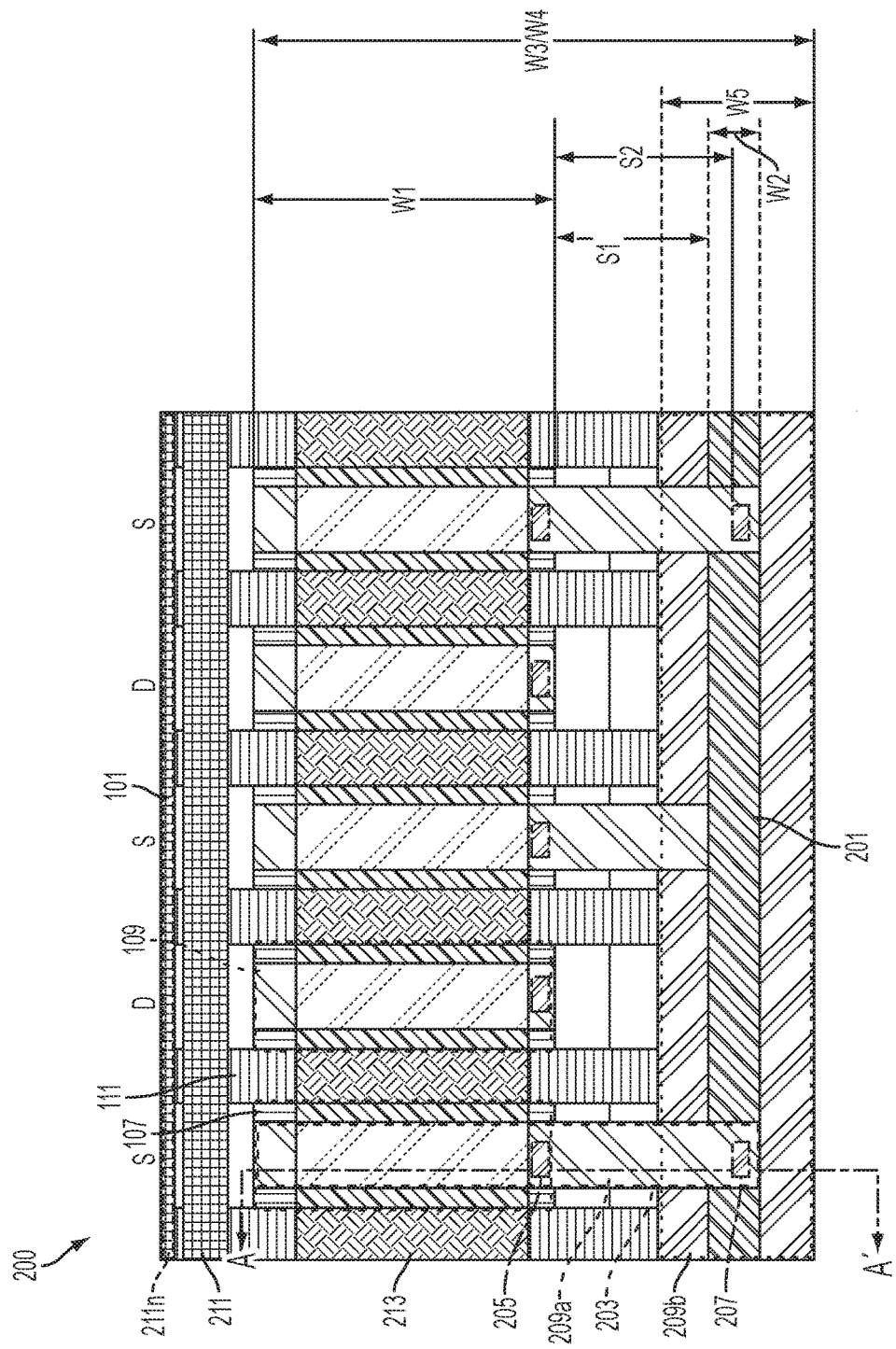
FIG. 2A is a diagram of a layout of the semiconductor device depicted in FIG. 1, in accordance with one or more embodiments.

FIG. 2A is a diagram of a layout 200 of the semiconductor device 100, in accordance with one or more embodiments.

The layout 200 comprises substrate 101, first layer 105 (FIG. 1), source region 107 in the first layer 105, drain region 109, gate structure 111, and a guard ring 201 separated from the source region 107 by a spacing S1. The layout 200 also comprises a first heat conductive layer 203 over the source region 107 and the guard ring 201. The first heat conductive layer 203 couples the source region 107 and the guard ring 201. In some embodiments, the first heat conductive layer 203 directly couples the source region 107 and the guard ring 201 to directly dissipate heat from the source region 107 to the guard ring 201. The layout 200 further comprises at least one source via 205 over a first portion of the first heat conductive layer 203 and at least one guard ring via 207 over a second portion of the first heat conductive layer 203. The at least one source via 205 is separated from the at least one guard ring via 207 by a spacing S2.

The layout 200 additionally comprises a second heat conductive layer 209 over the at least one source via 205 and the at least one guard ring via 207. The second heat conductive layer 209 couples the at least one source via 205 and the at least one guard ring via 207, thereby additionally coupling the source region 107 to the guard ring 201 by way of at least the at least one source via 205, the second heat conductive layer 209, and the at least one guard ring via 207. In some embodiments, the second heat conductive layer 209 is used in the semiconductor device 100 as an electrically coupled component of the semiconductor device 100 configured to connect the source region 107 to one or more other circuit elements of the semiconductor device 100. The gate structure 111 is between the source region 107 and the drain region 109. The layout 200 also comprises a gate contact 211 that couples the gate structure 111 to one or more other gate structures 111 in the layout 200. In some embodiments, gate contact 211 is also configured to contact the second heat conductive layer 209. The layout 200 further comprises a drain contact 213 that couples the drain region 109 to one or more other drain regions 109 of the layout 200.

The source region 107 has a width W1, the guard ring 201 has a width W2, the first heat conductive layer 203 has a width W3. In some embodiments, the width W3 is at least slightly greater than the spacing S1 to couple the source region 107 and the guard ring 201. In some embodiments, the width W3 is greater than or equal to a sum of the width W1, the width W2 and the spacing S1. For example, in some embodiments, the first heat conductive layer 203 has a width W3 that extends from the source region 107 at least to an edge of the guard ring 201. In other embodiments, the first heat conductive layer 203 has a width W3 that extends from the source region 107 beyond the edge of the guard ring 201 in a direction away from the source region 107.

The second heat conductive layer 209 has a first portion 209a and a second portion 209b. The first portion 209a is above the first heat conductive layer 203 and extends in a direction along the width W3 of the first heat conductive layer 203. The second portion 209b is above the guard ring 201 and extends along a length of the guard ring 201. The first portion 209a has a width W4 and the second portion 209b has a width W5. In some embodiments, the width W4 is at least slightly greater than the spacing S2 to couple the at least one source via 205 and the at least one guard ring via 207. In some embodiments, the width W4 is greater than or equal to a sum of the width W1, the width W2 and the spacing S1. For example, in some embodiments, the second heat conductive layer 209 has a width W4 that extends from the source region 107 at least to an edge of the guard ring 201. In other embodiments, the second heat conductive layer 209 has a width W4 that extends from the source region 107 beyond the edge of the guard ring 201 in a direction away from the source region 107. In some embodiments, the width W4 is less than the sum of W1 and S1 such that the second heat conductive layer 209 does not extend from the source region 107 to the guard ring 201.

In some embodiments, the width W1 is established and the width W2 is maximized in compliance with a design rule associated with a minimum allowable spacing S1. In other embodiments, one or more design rules are ignored to maximize W1 and/or W2 to maximize heat dissipation. In some embodiments, the width W5 is maximized within an available spacing of the semiconductor device 100.

In some embodiments, the first heat conductive layer 203 comprises one or more of an oxide defined region, a metal line, or other suitable material having the capability of transferring heat. In some embodiments, the second heat conductive layer 209 comprises a metal line or other suitable electrically conductive material. In some embodiments, the heat conductivity of the first heat conductive layer 203 and the second heat conductive layer 209 are substantially the same. In other embodiments, the heat conductivity of the first heat conductive layer 203 and the second heat conductive layer 209 are different.

In some embodiments, the gate contact 211 and the drain contact 213 comprise metal lines or other suitable electrically conductive materials. In some embodiments, the gate contact 211 and the drain contact 213 comprise a same material. In other embodiments, the gate contact 211 and the drain contact 213 comprise different materials.

In use, the semiconductor device 100 generates heat. The generated heat dissipates, at least partially, from the source region 107 through the first heat conductive layer 203 to the guard ring 201 and the substrate 101. In some embodiments, the heat dissipates directly to the guard ring 201. If the heat does not entirely dissipate through the first heat conductive layer 203, some of the heat dissipates through one or more of the second heat conductive layer 209, the gate contact 211 or the drain contact 213. Any heat that dissipates through the second heat conductive layer 209, the gate contact 211, and/or the drain contact 213 is minimized because a majority of heat dissipated from the source region 107 dissipates through the first heat conductive layer 203 to the guard ring 201. In some embodiments, an extended second heat conductive layer 209 makes it possible to dissipate further heat from the second heat conductive layer 209 as does the maximized width W5 of the second heat conductive layer 209.

In some embodiments, to further dissipate generated heat, the layout 200 further comprises at least one additional gate contact 211n coupled to the gate structure 111. For example, to further dissipate heat, the layout 200 optionally comprises double or triple gate contacts 211 at single side or a double side of the gate structure 111. Additionally, a maximum possible or allowable width for the gate contacts 211 is usable to further dissipate generated heat as allowed by one or more design rules. Also, in some embodiments, the semiconductor device 100 comprises one or more additional heat conductive layers or features that are configured to dissipate generated heat from at least the source region 107 to reduce heating of the second heat conductive layer 209 and improve device performance and reliability. Because heat generated in the semiconductor device 100 almost identically heats the source region 107 and the drain region 109, and because common semiconductor devices only focus on mitigating temperature increases by dissipating generated heat from the drain region, the heat dissipated by the semiconductor device 100 is capable of increasing the amount of heat dissipated from a semiconductor device by about 50%.

Figure 2B:
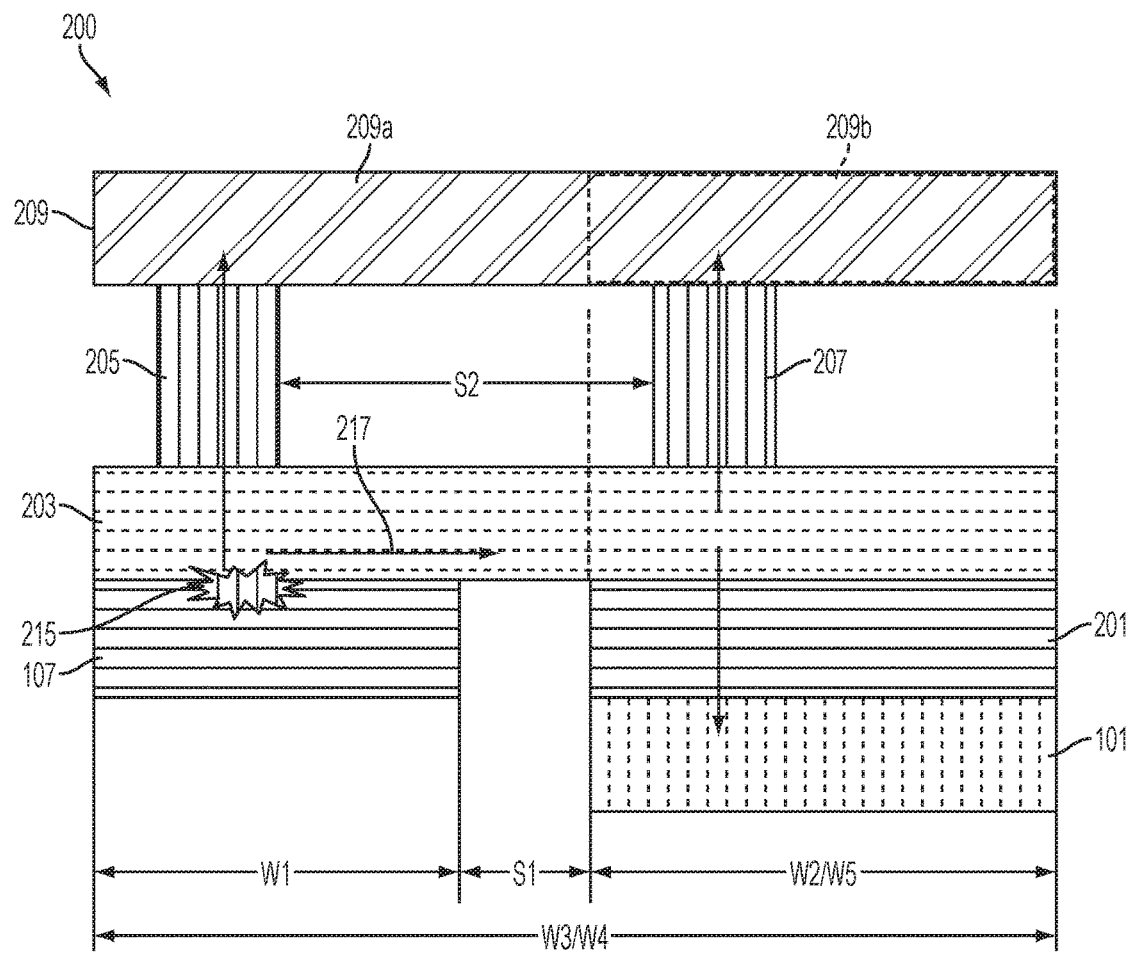
FIG. 2B is a cross-section view of the layout of the semiconductor device taken along cross-section A-A' depicted in FIG. 2A, in accordance with one or more embodiments.

FIG. 2B is a cross-section view of the layout 200 of the semiconductor device 100 taken along cross-section A-A' shown in FIG. 2A, in accordance with one or more embodiments.

Heat 215 generated by the semiconductor device 100 dissipates from the source region 107 to the guard ring 201 and the substrate 101 as indicated by arrows 217. If the heat 215 is not entirely dissipated to the guard ring 201 by way of the first heat conductive layer 203, then some of the heat 215 dissipates to one or more of the at least one source via 205, the at least one guard ring via 207, the first portion 209a of the second heat conductive layer 209, or the second portion 209b of the second heat conductive layer 209. The illustrated cross-section A-A' shows the spacing S1 between the source region 107 and the guard ring 201, the spacing S2 between the at least one source via 205 and the at least one guard ring via 207, the width W1, the width W2, the width W3, the width W4, and the width W5. Extending one or more of W3 or W4 to be beyond guard ring via 207 as shown increases the heat dissipation capabilities of the semiconductor device 100.

Figure 3A:
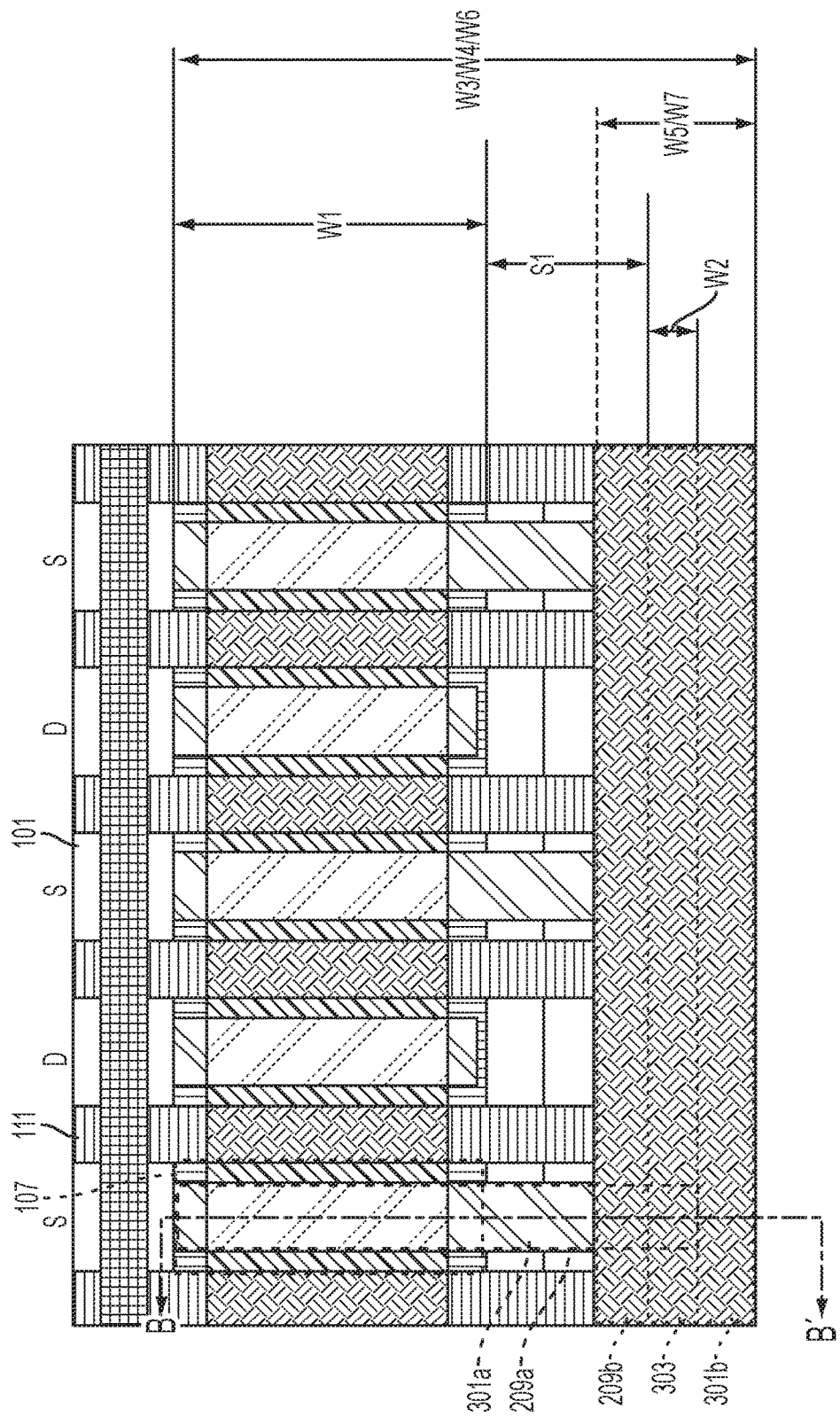
FIG. 3A is a diagram of a layout of the semiconductor device depicted in FIG. 1, in accordance with one or more embodiments.

FIG. 3A is a diagram of a layout 300 of the semiconductor device 100, in accordance with one or more embodiments.

Layout 300 comprises many of the features discussed with respect to layout 200 (FIGS. 2A and 2B). Layout 300 further comprises at least one additional heat conductive layer 301 having a first portion 301a and a second portion 301b over the first portion 209a and the second portion 209b of the second heat conductive layer 209. The first portion 301a has a width W6 and the second portion 301b has a width W7.

The at least one additional heat conductive layer 301 has a width W6. In some embodiments, the width W6 is greater than or equal to a sum of the width W1, the width W2 and the spacing S1. In other words, in some embodiments, the width W6 of the at least one additional heat conductive layer 301 is equal to the width W4 of the second heat conductive layer 209. In other embodiments, the width W6 of the at least one additional heat conductive layer 301 is different from the width W4 of the second heat conductive layer 209. In some embodiments, the width W7 is equal to the width W5. In some embodiments, the width W7 is maximized within an available spacing of the semiconductor device 100. In some embodiments, the design rules are not applicable because the at least one additional heat conductive layer 301 is free from electrical connection to the source region 107 and/or other circuit elements of the semiconductor device 100. If, for example, at least one additional heat conductive layer 301 is electrically connected to the second heat conductive layer 209, and in compliance with the design rules, such a layer has the capability of not only increasing heat dissipation from the second heat conductive layer 209, but also decreasing a resistance of the second heat conductive layer 209 to improve device performance. In some embodiments, the at least one additional heat conductive layer is over at least a portion of the gate structure 111.

The layout 300 makes it possible for generated heat 215 (FIG. 2B) to dissipate to the at least one additional heat conductive layer 301 to promote a reduction of an amount of heat that dissipates through the second heat conductive layer 209.

In some embodiments, the at least one additional heat conductive layer 301 comprises one or more of an oxide defined region, a metal line, or other suitable material having the capability of transferring heat. In some embodiments, the heat conductivity of the at least one additional heat conductive layer 301, the first heat conductive layer 203, and/or the second heat conductive layer 209 are substantially the same. In other embodiments, the heat conductivity of the at least one additional heat conductive layer 301, the first heat conductive layer 203, and/or the second heat conductive layer 209 are different.

Though illustrated as being a single additional heat conductive layer 301, the layout 300 in some embodiments, includes any number of additional heat conductive layers 301 to increase heat dissipation capabilities of the semiconductor device 100. Further, if the semiconductor device 100 includes more than one additional heat conductive layer 301, the additional heat conductive layer 301 need not comprise the same material or all be free from electrical connection to the source region 107, the second heat conductive layer 209, or other circuit elements.

In some embodiments, the at least one additional heat conductive layer 301 is coupled to the second heat conductive layer 209 or first heat conductive layer 203 (FIG. 2A) by way of one or more additional vias 303. In other embodiments, the at least one additional heat conductive layer is directly on the second heat conductive layer 209. If an embodiment includes more than one additional heat conductive layer 301, the more than one additional heat conductive layers 301 are coupled to one another by a combination of direct contact or additional vias 303.

Figure 3B:
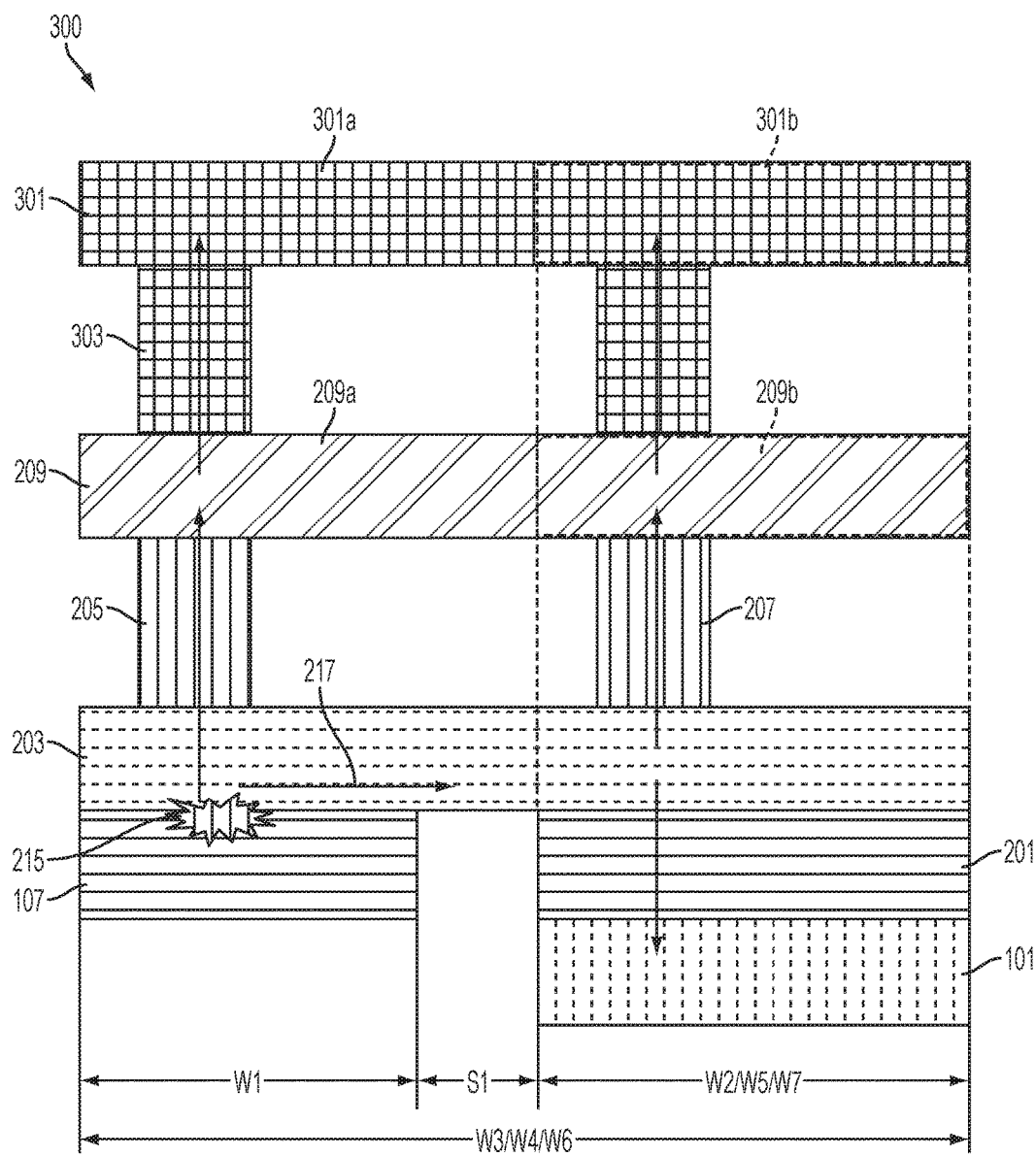
FIG. 3B is a cross-section view of the layout of the semiconductor device taken along cross-section B-B' depicted in FIG. 3A, in accordance with one or more embodiments.

FIG. 3B is a cross-section view of the layout 300 of the semiconductor device 100 taken along cross-section B-B' shown in FIG. 3A, in accordance with one or more embodiments.

Heat 215 generated by the semiconductor device 100 dissipates from the source region 107 to the guard ring 201 and the substrate 101 as indicated by arrows 217. If the heat 215 is not entirely dissipated to the guard ring 201 by way of the first heat conductive layer 203, then some of the heat 215 dissipates to one or more of the at least one source via 205, the at least one guard ring via 207, the first portion 209a of the second heat conductive layer 209, the second portion 209b of the second heat conductive layer 209, the first portion 301a of the at least one additional heat conductive layer 301, the second portion 301b of the at least one additional heat conductive layer 301, or one or more of the additional vias 303. The illustrated cross-section B-B' shows the spacing S1 between the source region 107 and the guard ring 201, the width W1, the width W2, the width W3, the width W4, and the width W5, the width W6, and the width W7. Extending width W6 to be beyond guard ring via 207 as shown increases the heat dissipation capabilities of the semiconductor device 100, as does maximizing the width W7.

Figure 4A:
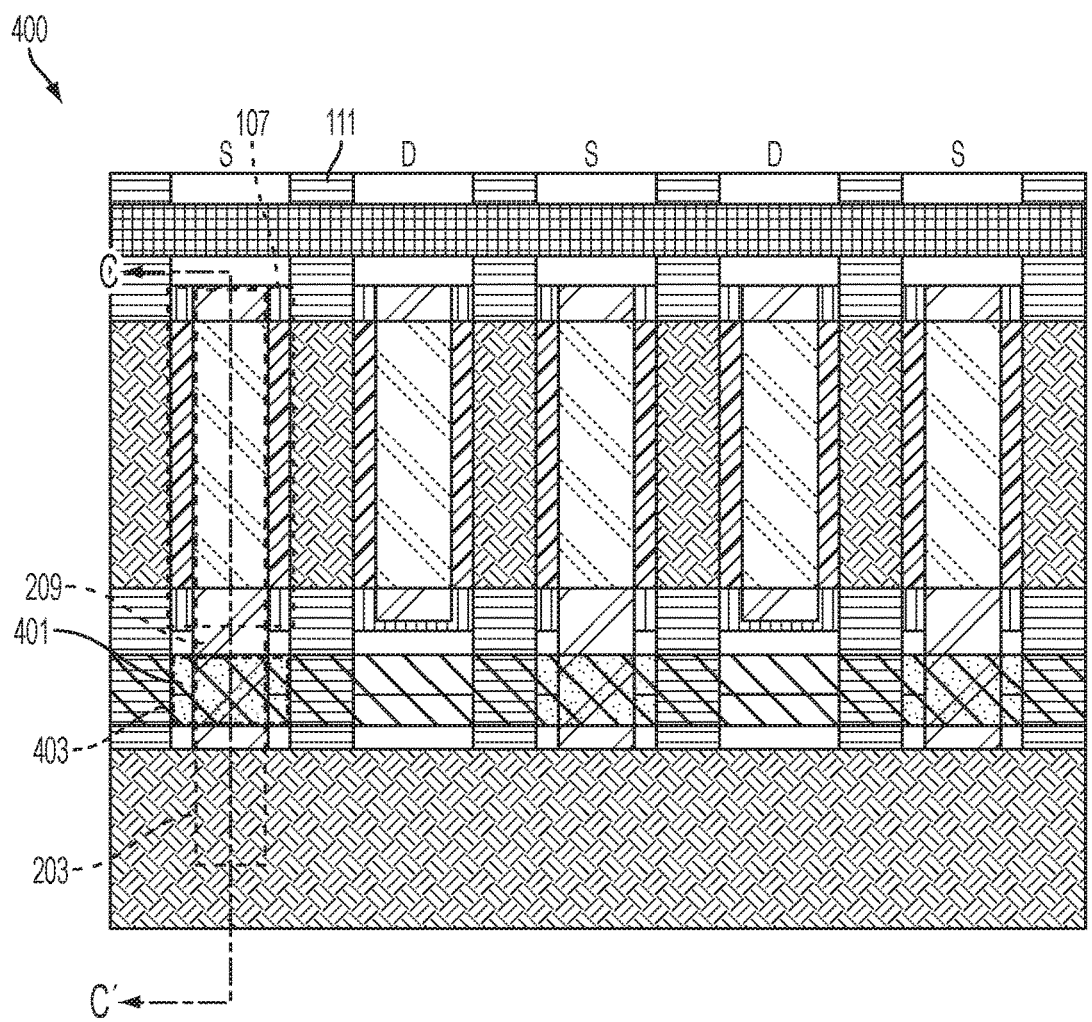
FIG. 4A is a diagram of a layout of the semiconductor device depicted in FIG. 1, in accordance with one or more embodiments.

FIG. 4A is a diagram of a layout 400 of the semiconductor device 100, in accordance with one or more embodiments.

Layout 400 comprises many of the features discussed with respect to layout 200 (FIGS. 2A and 2B) and/or layout 300 (FIGS. 3A and 3B). Layout 400 further comprises at least one additional heat conductive layer 401 coupled to the first heat conductive layer 203 by one or more additional vias 403. In some embodiments, one or more of the at least one additional heat conductive layer(s) 401 are directly coupled to the first conductive layer without an intermediary additional via 403 which increases the heat dissipation capabilities of the semiconductor device 100. The at least one additional heat conductive layer 401 is configured to be over the first heat conductive layer 203. In some embodiments, one or more of the at least one additional heat conductive layer(s) 401 is over the second heat conductive layer 209. In some embodiments, one or more of the at least one additional heat conductive layer(s) 401 is below the second heat conductive layer 209.

Figure 4B:
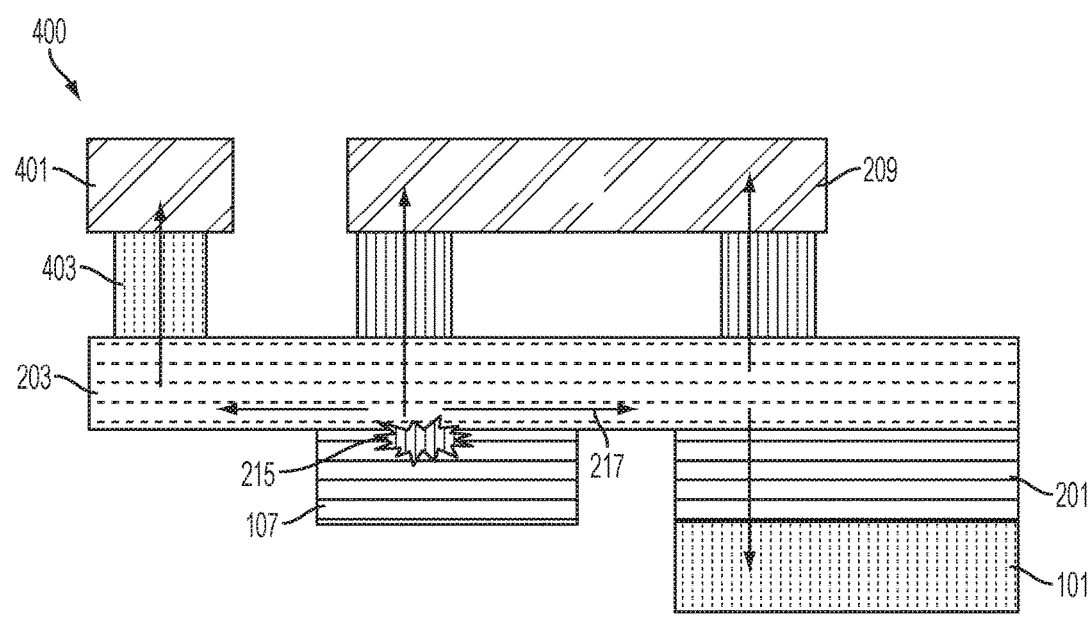
FIG. 4B is a cross-section view of the layout of the semiconductor device taken along cross-section C-C' depicted in FIG. 4A, in accordance with one or more embodiments.

In some embodiments, the at least one additional conductive layer 401 is separated from the second conductive layer 209 by a spacing S3 (FIG. 4B). In some embodiments, a width of the at least one additional conductive layer 401 and/or the second conductive layer 209 is maximized to comply with a design rule associated with a minimum spacing allowable for spacing S3.

In some embodiments, the at least one additional heat conductive layer 401 is free from electrical connection to the second heat conductive layer 209 and/or one or more other circuit elements of the semiconductor device 100. In some embodiments, the at least one additional heat conductive layer 401 is directly in contact with the first conductive layer 103 without an intermediary additional via 403.

The layout 400 makes it possible for generated heat 215 (FIG. 2B) to dissipate to the at least one additional heat conductive layer 401 to promote a reduction of an amount of heat that dissipates through the second heat conductive layer 209. Heat dissipated to the at least one additional heat conductive layer 401 aids in reducing effects generated heat 215 has on the performance of the semiconductor device 100 because, in some embodiments, the at least one additional heat conductive layer 401 is free from electrical connection from the source region and/or other circuit elements of the semiconductor device 100.

In some embodiments, the at least one additional heat conductive layer 401 comprises one or more of an oxide defined region, a metal line, or other suitable material having the capability of transferring heat. In some embodiments, the heat conductivity of the at least one additional heat conductive layer 401, the first heat conductive layer 203, and/or the second heat conductive layer 209 are substantially the same. In other embodiments, the heat conductivity of the at least one additional heat conductive layer 401, the first heat conductive layer 203, and/or the second heat conductive layer 209 are different.

FIG. 4B is a cross-section view of the layout 400 of the semiconductor device 100 taken along cross-section C-C' shown in FIG. 4A, in accordance with one or more embodiments.

Heat 215 generated by the semiconductor device dissipates from the source region 107 to the guard ring 201 and the substrate 101 as indicated by arrows 217. If the heat 215 is not entirely dissipated to the guard ring 201 by way of the first heat conductive layer 203, then some of the heat 215 dissipates to one or more of the at least one source via 205, the at least one guard ring via 207, the second heat conductive layer 209, the one or more additional vias 403, or the at least one additional heat conductive layer 401.

Figure 5:
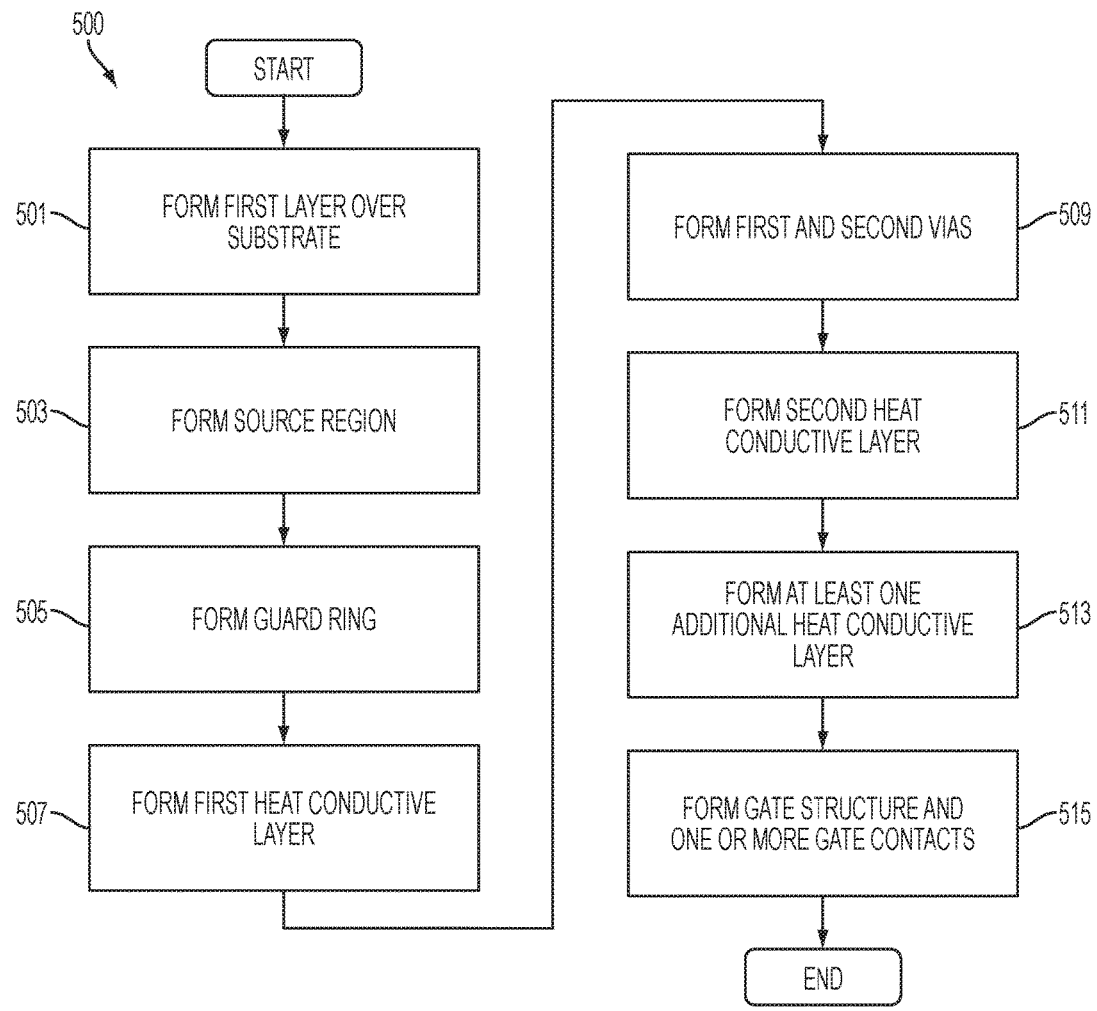
FIG. 5 is a flow chart of a method of forming a semiconductor device, in accordance with one or more embodiments.

FIG. 5 is a flow chart of a method 500 of forming a semiconductor device such as semiconductor device 100, in accordance with one or more embodiments. Method 500 begins with step 501 in which a first layer over a substrate by, for example, a deposition, epitaxial growth process, or other suitable process.

In step 503, a source region is formed in the first layer by, for example, an ion implantation process or other suitable process.

In step 505, a guard ring is formed over the substrate by, for example, a deposition, epitaxial growth process, an etching process, other suitable process, or combination thereof. The guard ring is formed such that the guard ring is separated from the source region by a first spacing. In some embodiments, the guard ring is in the first layer or is a portion of the first layer that is caused to be separated from the source region. In some embodiments, the guard ring is in another layer or is a separately formed feature in a same or different level of the semiconductor device separated from the source region.

In step 507, a first heat conductive layer is formed over the source region by, for example, a deposition, epitaxial growth process, or other suitable process. The first heat conductive layer coupling the source region and the guard ring. In some embodiments, the source region has a first width, guard ring has a second width, the first heat conductive layer has a third width, and the third width is greater than or equal to a sum of the first width, the second width and the spacing.

In step 509, a first via is formed over a first portion of the first heat conductive layer and a second via is formed over a second portion of the first heat conductive layer. The first via and the second via are formed such that the first via and the second via are separated by a spacing. In some embodiments, the first portion of the heat conductive layer corresponds with the source region and the second portion of the first conductive layer corresponds with the guard ring. In some embodiments, the first and second vias are formed by a deposition process, an epitaxial growth process, an etching process, other suitable process, or combination thereof.

In step 511, a second heat conductive layer is formed over the first via and the second via by, for example, a deposition, epitaxial growth process, or other suitable process. The second heat conductive layer couples the first via and the second via. In some embodiments, the second heat conductive layer has a fourth width, and the fourth width is greater than or equal to a sum of the first width, the second width and the spacing.

In use, the semiconductor device generates heat, and the heat dissipates, at least partially, from the source region through the first heat conductive layer to the guard ring and the substrate.

In step 513, at least one additional heat conductive layer is formed over the second heat conductive layer by, for example, a deposition, an epitaxial growth process, or other suitable process. The at least one additional heat conductive layer has a fourth width, the fourth width is greater than or equal to a sum of the first width, the second width and the spacing, and heat dissipates to the at least one additional heat conductive layer. In some embodiments, the at least one additional heat conductive layer is free from electrical connection from the source region.

In step 515, a gate structure is formed over the substrate between the source and the drain regions, and one or more gate contacts are formed over the first heat conductive layer. The gate structure and/or the one or more gate contacts are formed by, for example, a deposition, an epitaxial growth process, or other suitable process. The gate contact(s) are coupled to the gate structure. Generated heat also dissipates from the source region to the gate contact(s). In some embodiments, the second heat conductive layer has a fifth width, and the fifth width is maximized within an available spacing of the semiconductor device 100.

Figure 6:
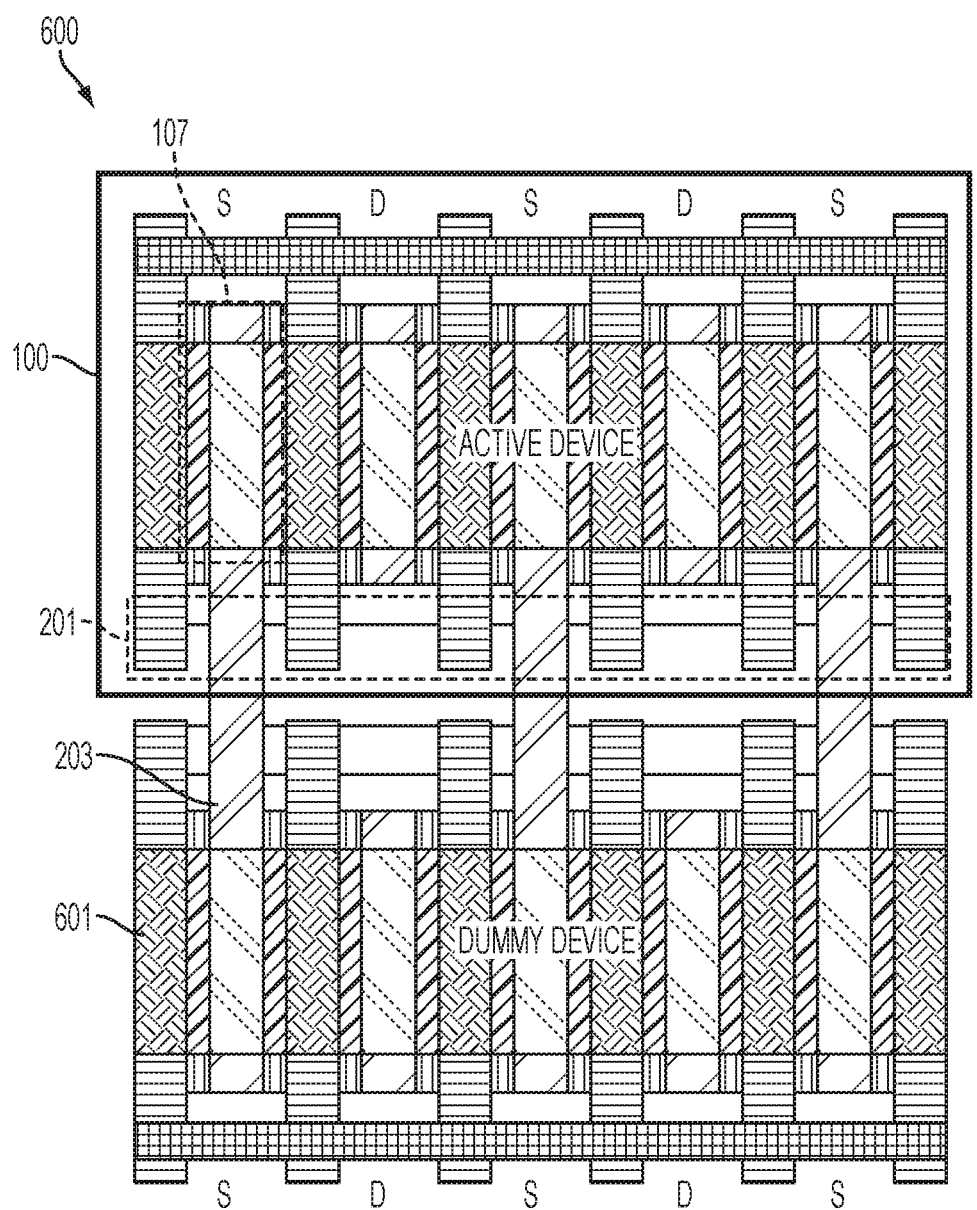
FIG. 6 is a diagram of a portion of a device array that includes at least one active semiconductor device and at least one dummy device, in accordance with one or more embodiments.

FIG. 6 is a diagram of a portion of a device array 600 that includes at least one active semiconductor device 100 and at least one dummy device 601, in accordance with one or more embodiments.

In some embodiments, one or more semiconductor devices 100 are configured to be active devices in the device array 600. In some embodiments, to further dissipate generated heat, the device array 600 comprises one or more dummy devices 601 that are coupled to the active semiconductor devices 100. In some embodiments, the one or more dummy devices 601 comprise similar or equivalent layouts to the active semiconductor devices 100. In other embodiments, the one or more dummy devices 601 comprise dummy metals, dummy polymer layers, dummy substrate, dummy oxide layers, or other suitable heat dissipation material or layer having a layout different from that of the semiconductor devices 100. In some embodiments, the one or more dummy devices are not active devices in the device array 600 and are included in the device array 600 not only to dissipate heat, but to also make manufacturability of the device array 600 more efficient.

In some embodiments, any of the features discussed with respect to FIGS. 1-4b are capable of being extended to couple an active semiconductor device 100 to one or more dummy devices 601. For example, in some embodiments, the first conductive layer 203 is configured to couple the active semiconductor device 100 to the dummy device 601 in the illustrated portion of device array 600. Accordingly, heat routed from the source region 107 to the guard ring 201 is not only dissipated to the guard ring 201, but is also dissipated to the dummy device 601 and any components thereof.

One aspect of this description relates to a method of forming a semiconductor device. The method includes implanting dopants in a first region of the semiconductor device to form a source region. The method further includes forming a guard ring in a second region of the semiconductor device, the guard ring being separated from the source region by a first spacing. The method further includes depositing a first heat conductive layer over the source region, wherein the first heat conductive layer is directly coupled to the source region and directly coupled to the guard ring. The first heat conductive layer is configured to dissipate heat generated by the semiconductor device from the source region to the guard ring.

Another aspect of this description relates to a method of forming a semiconductor device. The method includes forming an active device. Forming the active device includes implanting dopants to form a source region. Forming the active device further includes forming a guard ring separated from the source region by a first spacing. Forming the active device further includes depositing a first heat conductive layer over the source region, wherein the first heat conductive layer is thermally coupled to the source region and thermally coupled to the guard ring. The method further includes forming a dummy device adjacent to the active device. Forming the dummy device includes implanting dopants to form a dummy source region. Forming the dummy device further includes forming a dummy guard ring separated from the dummy source region by a second spacing, wherein the first heat conductive layer is thermally connected to the dummy source region and is thermally coupled to the dummy guard ring.

Still another aspect of this description relates to a method of forming a semiconductor device. The method includes forming an active device. Forming the active device includes forming an active gate structure. Forming the active device further includes implanting dopants to form a source region adjacent to the active gate structure. Forming the active device further includes forming a guard ring separated from the source region by a first spacing. The method further includes forming a dummy device adjacent to the active device. Forming the dummy device includes forming a dummy gate structure. Forming the dummy device further includes implanting dopants to form a dummy source region adjacent to the dummy gate structure. The method further includes depositing a first heat conductive layer thermally connected to the source region, the guard ring and the dummy source region.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. A method of forming a semiconductor device, the method comprising:
   implanting dopants in a first region of the semiconductor device to form a source region;
   forming a guard ring in a second region of the semiconductor device, the guard ring being separated from the source region by a first spacing;
   depositing a first heat conductive layer over the source region, wherein the first heat conductive layer is directly coupled to the source region and directly coupled to the guard ring, and the first heat conductive layer is configured to dissipate heat generated by the semiconductor device from the source region to the guard ring.

2. The method of claim 1, wherein implanting the dopants comprises forming the source region having a first width, forming the guard ring comprises forming the guard ring having a second width, depositing the first heat conductive layer comprises depositing the first heat conductive layer having a third width, and the third width is greater than or equal to a sum of the first width, the second width and the first spacing.

3. The method of claim 2, further comprising depositing a second heat conductive layer over the first heat conductive layer, wherein the second heat conductive layer has a fourth width, and the fourth width is greater than or equal to a sum of the first width, the second width and the first spacing.

4. The method of claim 3, further comprising:
   depositing at least one additional heat conductive layer over the second heat conductive layer, wherein the at least one additional heat conductive layer has a fifth width, the fifth width is greater than or equal to a sum of the first width, the second width and the first spacing.

5. The method of claim 4, wherein depositing the at least one additional heat conductive layer comprises depositing the at least one additional heat conductive layer free from electrical connection with the second heat conductive layer.

6. The method of claim 3, wherein depositing the second heat conductive layer comprises maximizing the fourth width within an available spacing.

7. The method of claim 1, further comprising:
   forming a gate structure; and depositing a gate contact over the first heat conductive layer, the gate contact being coupled to the gate structure.

8. The method of claim 7, further comprising:
depositing at least one additional gate contact over the first heat conductive layer, wherein the at least one additional gate contact is coupled to the gate structure.

9. The method of claim 3, wherein depositing the second heat conductive layer comprises depositing the second heat conductive layer having a heat conductivity substantially equal to a heat conductivity of the first heat conductive layer.

10. A method of forming a semiconductor device, the method comprising:
 forming an active device, wherein forming the active device comprises:
  implanting dopants to form a source region,
  forming a guard ring separated from the source region by a first spacing, and
  depositing a first heat conductive layer over the source region, wherein the first heat conductive layer is thermally coupled to the source region and thermally coupled to the guard ring; and
 forming a dummy device adjacent to the active device, wherein forming the dummy device comprises:
  implanting dopants to form a dummy source region, and
  forming a dummy guard ring separated from the dummy source region by a second spacing, wherein the first heat conductive layer is thermally connected to the dummy source region and is thermally coupled to the dummy guard ring.

11. The method of claim 10, wherein forming the guard ring comprises forming the guard ring between the source region and the dummy device.

12. The method of claim 10, wherein depositing the first heat conductive layer comprises depositing the first heat conductive layer directly on the source region.

13. The method of claim 10, further comprising depositing a second heat conductive layer over the first heat conductive layer, wherein the second heat conductive layer is thermally connected to the first heat conductive layer.

14. The method of claim 13, further comprising depositing at least one via to thermally connect the first heat conductive layer to the second heat conductive layer.

15. The method of claim 13, wherein depositing the second heat conductive layer comprises depositing the second heat conductive layer directly on the first heat conductive layer.

16. The method of claim 13, further comprising depositing a third heat conductive layer over the first heat conductive layer, wherein the third heat conductive layer is thermally connected to the first heat conductive layer.

17. The method of claim 16, wherein depositing the second heat conductive layer comprises depositing the second heat conductive layer over a first region of the first heat conductive layer, depositing the third heat conductive layer comprises depositing the third heat conductive layer over a second region of the first heat conductive layer, and the first region is different from the second region.

18. A method of forming a semiconductor device, the method comprising:
 forming an active device, wherein forming the active device comprises:
  forming an active gate structure,
  implanting dopants to form a source region adjacent to the active gate structure,
  forming a guard ring separated from the source region by a first spacing; and
 forming a dummy device adjacent to the active device, wherein forming the dummy device comprises:
  forming a dummy gate structure,
  implanting dopants to form a dummy source region adjacent to the dummy gate structure; and
  depositing a first heat conductive layer thermally connected to the source region, the guard ring and the dummy source region.

19. The method of claim 18, wherein depositing the first heat conductive layer comprises depositing a continuous material.

20. The method of claim 18, further comprising depositing a second heat conductive layer over the first heat conductive layer, wherein the second heat conductive layer is offset from at least one of the source region, the guard ring or the dummy source region.

* * * * *